(12) United States Patent
Deng et al.

(10) Patent No.: US 11,495,301 B2
(45) Date of Patent: Nov. 8, 2022

(54) SENSE AMPLIFIER LOOK-THROUGH LATCH FOR FAMOS-BASED EPROM

(71) Applicant: TEXAS INSTRUMENTS INCORPORATED, Dallas, TX (US)

(72) Inventors: Xiaowei Deng, Plano, TX (US); Yunchen Qiu, Plano, TX (US); David Joseph Toops, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/219,092

(22) Filed: Mar. 31, 2021

(65) Prior Publication Data

US 2021/0304824 A1 Sep. 30, 2021

Related U.S. Application Data

(60) Provisional application No. 63/002,725, filed on Mar. 31, 2020.

(51) Int. Cl.
*G11C 7/00* (2006.01)
*G11C 16/26* (2006.01)

(52) U.S. Cl.
CPC .................................. *G11C 16/26* (2013.01)

(58) Field of Classification Search
USPC .................... 365/189.05, 206, 207
See application file for complete search history.

(56) References Cited

U.S. PATENT DOCUMENTS

| 8,837,244 B2 * | 9/2014 | Huang | G11C 7/062 365/203 |
| 9,641,159 B1 * | 5/2017 | Liao | H03K 3/0372 |
| 2011/0128797 A1 * | 6/2011 | Hong | G11C 7/065 365/198 |

OTHER PUBLICATIONS

"A 7.6 mW, 414 fs RMS-Jitter 10 GHz Phase-Locked Loop for a 40 GB/s Serial Link Transmitter Based on a Two-Stage Ring Oscillator in 65 nm CMOS"; Bae, et al., IEEE Journal of Solid-State Circuits, vol. 51, No. 10, Oct. 2016, pp. 2357-2367.

* cited by examiner

*Primary Examiner* — Son T Dinh
(74) *Attorney, Agent, or Firm* — Andrew R. Ralston; Charles A. Brill; Frank D. Cimino

(57) ABSTRACT

In one example a semiconductor device has a data latch that includes first and second transmission gates and first and second inverters. The first inverter is connected between a first terminal of the first transmission gate and a first terminal of the second transmission gate. The second inverter is connected between a second terminal of the first transmission gate and a second terminal of the second transmission gate. The data latch is configured to store a datum received at the connection between the first transmission gate and the second inverter, and to store a datum received at the connection between the second transmission gate and the first inverter.

21 Claims, 14 Drawing Sheets

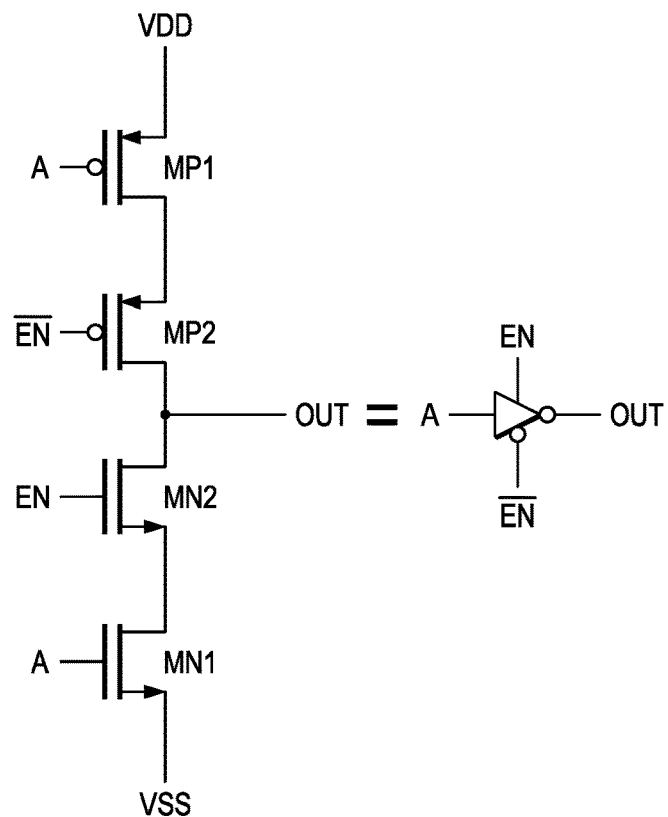
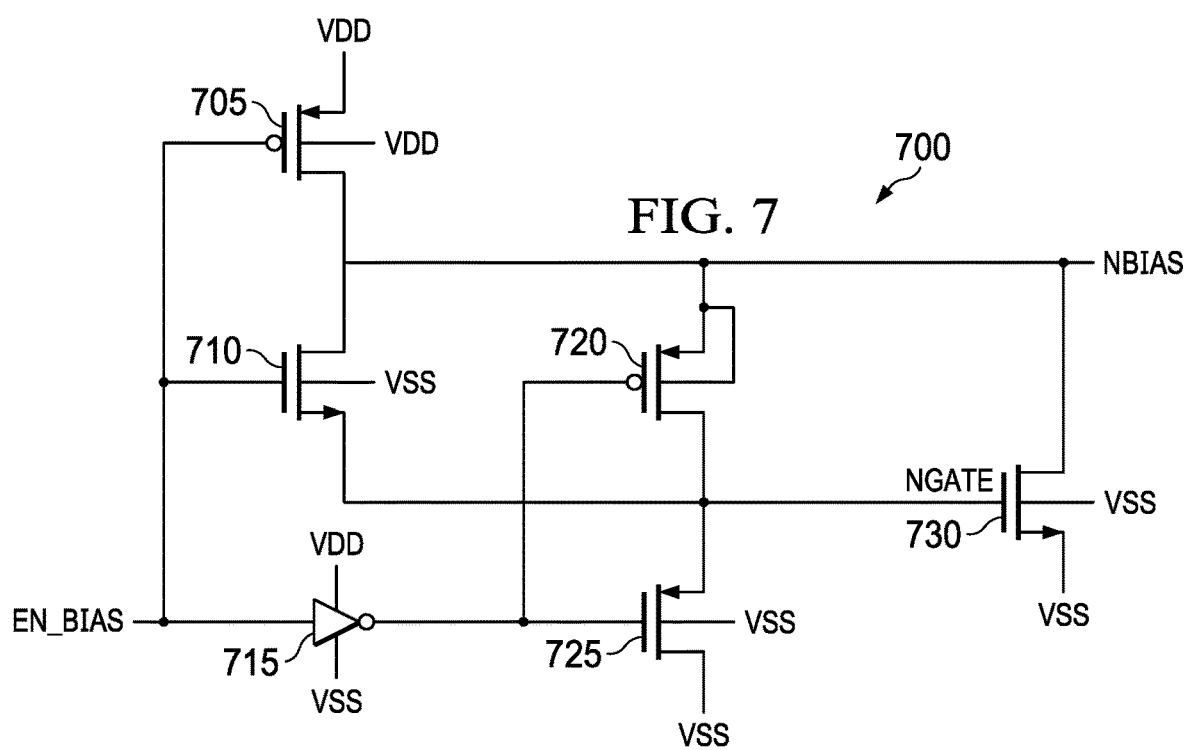

SENSE AMPLIFIER LOOK-THROUGH LATCH FOR FAMOS-BASED EPROM

CROSS-REFERENCE TO RELATED APPLICATIONS

This application claims priority to U.S. Provisional Patent Application Ser. No. 63/002,725, filed on Mar. 31, 2020, which is incorporated herein by reference in its entirety.

FIELD

This disclosure relates to the field of semiconductor devices, and more particularly, but not exclusively, to programmable memory cells.

BACKGROUND

Floating-gate avalanche-injection MOS (FAMOS) based erasable programmable read only memories (EPROM's), sometimes referred to as one time programmable (OTP) nonvolatile memories (NVM's), are sometimes used for trimming component values, e.g., resistor values, and for nonvolatile data storage in analog products.

SUMMARY

The inventors disclose various methods and devices that may be beneficially applied to programmable read-only memories based on floating-gate avalanche injection MOS transistors. While such implementations may be expected to provide improvements, e.g. look-through reading of latched data prior to programming and/or reduction of die area, no particular result is a requirement of the described invention(s) unless explicitly recited in a particular claim.

In one example, a semiconductor device has a data latch that includes first and second transmission gates and first and second inverters. The first inverter is connected between a first terminal of the first transmission gate and a first terminal of the second transmission gate. The second inverter is connected between a second terminal of the first transmission gate and a second terminal of the second transmission gate. The data latch may be configured to store a datum received at the connection between the first transmission gate and the second inverter, and to store a datum received at the connection between the second transmission gate and the first inverter.

An OTP trim bit memory cell 200, referred to generally as a cell 200, used in some baseline technology is shown in FIG. 2A. The cell 200 includes various electronic devices formed in or over a semiconductor substrate 201, e.g. a silicon substrate, or handle wafer, having a P-type epitaxial layer formed thereover. The cell 200 includes various control signal inputs that support programming to and reading from a latch 210, described in greater detail in FIG. 2B. The control signals include a program enable signal PROG_EN that may generally enable the writing a datum to OTP transistors 205. A data input signal DIN provides a logical value of the datum to be stored on the OTP transistors 205. A BIAS_CLAMP signal may be used to establish a voltage level used to bias a reference current generation circuit and to limit a bit line voltage from dropping to low during read. A PBIAS signal and a TM_EMZ signal may be used in a test mode of the cell 200. And a READ_EN signal may enable the output by the cell 200 of a logical value corresponding to the datum stored in the OTP transistors 205. A data output signal DOUT, and its complement DOUTB, provide during a read operation the logical value of the datum stored on the OTP transistors 205. With the exception of the DIN and DOUT/DOUTB signals, the other described signals may be common to each of a plurality of instances of the cell 200. In contrast, the DIN and DOUT/DOUTB signals are specific to a particular instance of the cell 200. In general, if the cell 200 represents bit N of a multi-bit storage array, DIN may be expressed as $DIN_N$, and DOUT may be expressed as $DOUT_N$.

In another example, a method of manufacturing an integrated circuit includes forming first, second, third and fourth PMOS transistors, and first, second, third and fourth NMOS transistors, in or over a semiconductor substrate. The method includes interconnecting the transistors to produce a bit cell as described in one or more of the previous examples.

BRIEF DESCRIPTION OF THE VIEWS OF THE DRAWINGS

FIGS. 4A-4D illustrate aspects of another example memory cell including a look-through latch in which transistors of the latch are stacked to reduce die area;

FIG. 7 illustrates an example circuit that provides a control signal to generate a sense amplified reference current in an example memory cell; and.

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Figure 1:
FIG. 1 schematically illustrates an example baseline one-time programmable (OTP) trim bit memory, which includes a control cell and a row of bit cells each containing complete FAMOS nonvolatile storage, write (program), and read circuits.

Floating gate avalanche injection MOS (FAMOS) transistor-based erasable programmable read-only memories (EPROMs) are sometimes referred to as one time programmable (OTP) nonvolatile memories (NVMs). Such transistors may be used for trimming the value of a component in an analog circuit, e.g., a resistor value, or to provide nonvolatile data storage in such circuits. OTPs may be viewed as having three main types for various applications. A first type is an OTP trim bit memory that may be used to trim a component value. Such a memory typically has a low bit count, e.g., up to 50 bits. A second type is an OTP trim array memory, which may be used to trim a component value with a greater number of bits, e.g. for greater trim precision. Such a memory may have a medium bit count, e.g., up to 2K bits. A third type of memory is an OTP array memory that may be used for data storage. This memory type may have a high bit count, e.g., up to 640K bits. The OTP trim bit memory is widely used, and typically includes a control cell and a row of bit cells, each bit cell containing complete FAMOS nonvolatile storage, write (program) circuits, and read circuits. This scheme is illustrated generally in FIG. 1.

Figure 2C:
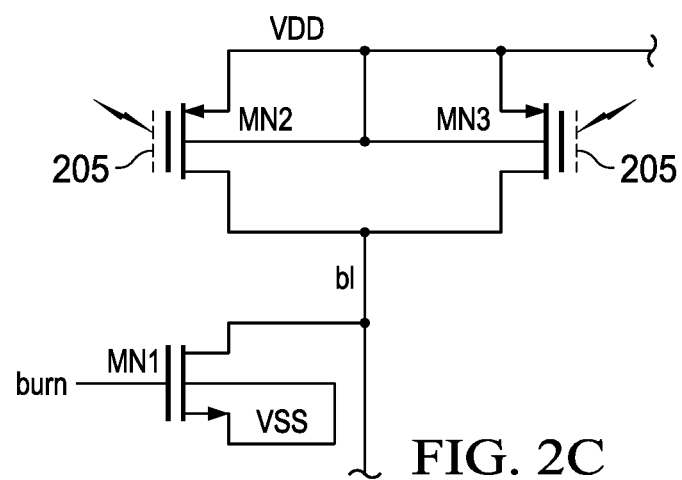
FIGS. 2A-2E illustrate various aspects of a circuit-level schematic of another example baseline trim bit memory cell, including a latch circuit that is asymmetrical and lacks look-through capability.
Figure 2A:
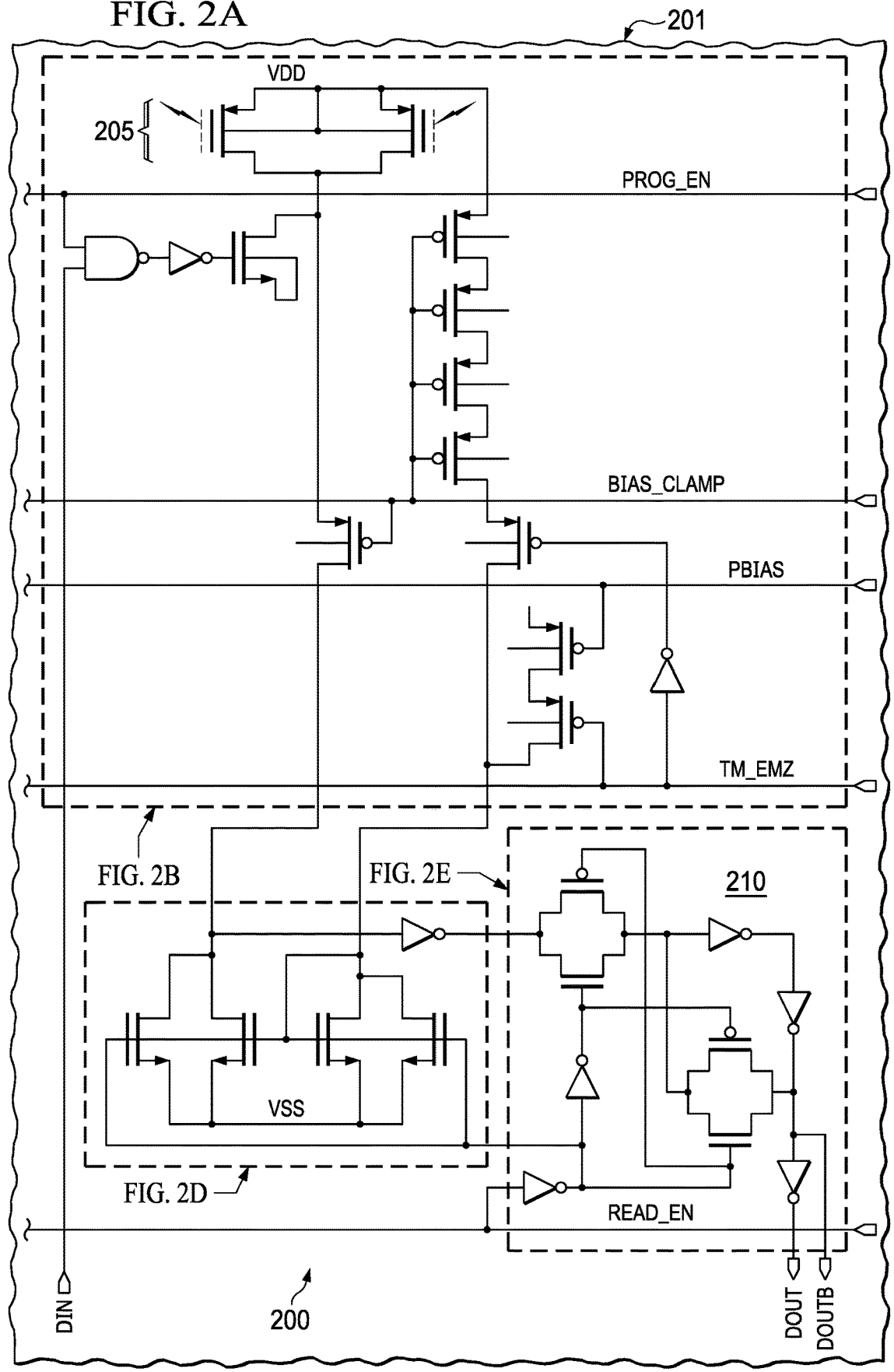

An OTP trim bit memory cell 200, referred to generally as a cell 200, used in some baseline technology is shown in FIG. 2A. The cell 200 includes various electronic devices formed in or over a semiconductor substrate 201, e.g. a silicon substrate, or handle wafer, having a P-type epitaxial layer formed thereover. The cell 200 includes various control signal inputs that support programming to and reading from a latch 210, described in greater detail in FIG. 2B. The control signals include a program enable signal PROG_EN that may generally enable the writing a datum to OTP transistors 205. A data input signal DIN provides a logical value of the datum to be stored on the OTP transistors 205. A BIAS_CLAMP signal may be used to establish a voltage level used to bias a reference current generation circuit and to limit a bit line voltage from dropping to low during read. A PBIAS signal and a TM_EMZ signal may be used in a test mode of the cell 200. And a READ_EN signal may enable the output by the cell 200 of a logical value corresponding to the datum stored in the OTP transistors 205. A data output signal DOUT, and its complement DOUTB, provide during a read operation the logical value of the datum stored on the OTP transistors 205. With the exception of the DIN and DOUT/DOUTB signals, the other described signals may be common to each of a plurality of instances of the cell 200. In contrast, the DIN and DOUT/DOUTB signals are specific to a particular instance of the cell 200. In general, if the cell 200 represents bit N of a multi-bit storage array, DIN may be expressed as $DIN_N$, and DOUT may be expressed as $DOUT_N$.

Figure 2B:
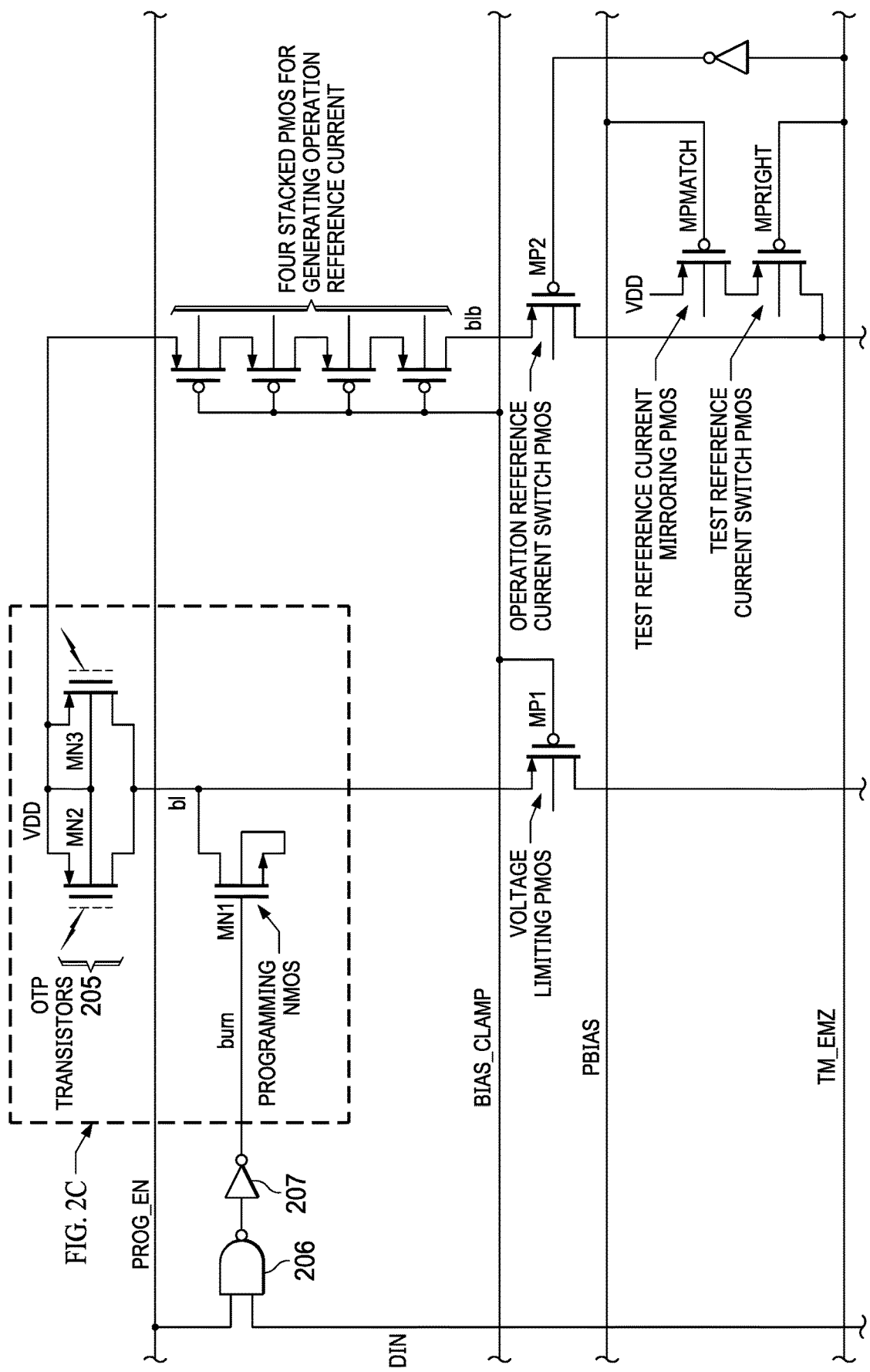

FIG. 2B provides a more detailed view of a portion of the cell 200 that includes the OTP transistors 205 and programming circuitry. The PROG_EN and DIN data are input to a NAND gate 206 and inverted by an inverter 207 to provide a burn signal to an NMOS transistor MN1. FIG. 2C illustrates MN1 and the OTP transistors 205 in greater detail. The OTP transistors may be implemented as avalanche-injection MOS transistors. Such transistors may store a datum by placing immobile charge on a gate electrode using an elevated programming voltage. Such charge may be stable for greater than 10 years, providing effectively nonvolatile storage of the datum. Typically, the OTP transistors 205 may be programmed with a stored charge only once, as there is no practical way to erase the stored value after production of the associated device. While a stored charge may be arbitrarily assigned as a digital "one" or a digital "zero", the discussion herein assumes without limitation that the stored charge indicates a "one", and lack of stored charge indicates a "zero". While two OTP transistors MN2 and MN3 are shown, any number of at least one OTP transistor may be used to implement the datum storage. In this example, two OTP transistors may provide redundancy without consuming excessive die area.

The one or more OTP transistors 205 are connected to a bitline bl, which is connected to the drain of MN1. When the burn signal is asserted, VDD is raised to a programming voltage, e.g. 7.5 V, and MN1 provides a low-resistance connection to VSS, typically ground. Under these conditions, charge is transferred to the gate of the OTP transistors 205 to define a stored value of "one". Conversely, the gate of the OTP transistors 205 is left uncharged in the event a "zero" is intended to be stored.

Returning to FIG. 2B, PMOS transistor MP1 may act to limit the voltage on bl from dropping too low under control of the BIAS_CLAMP signal. This feature limits the VDD to bl voltage difference to within a value that prevents data loss on OTP transistors 205 during read. The bl current is propagated by the transistor MP1 to the node designated sal, or "sense amplifier left". A reference current is generated onto node sar, or "sense amplifier right", by four stacked PMOS transistors connected to VDD and controlled by the BIAS_CLAMP signal and a current switch PMOS transistor MP2 controlled by the RM_EMZ signal. A test reference current may be applied to the sar node by PMOS transistors MPMATCH and MPRIGHT, the former controlled by the PBIAS signal, and the latter controlled by the TM_EMZ signal.

Figure 2D:
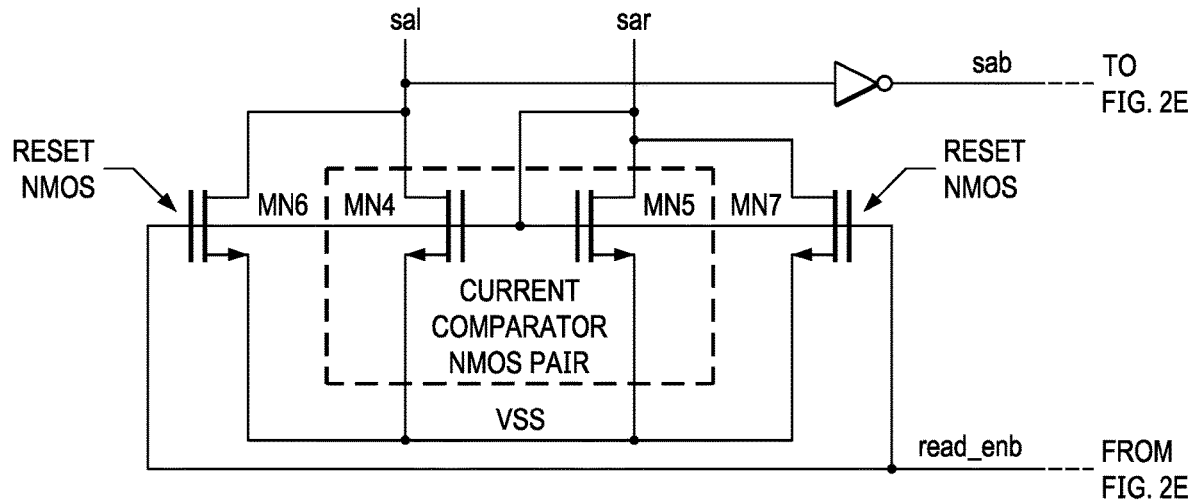

Referring to FIG. 2D, a sense amplifier circuit includes current mirror transistors MN4 and MN5, and reset NMOS transistors MN6 and MN7, all under control of the read_enb signal. The transistors MN4 and MN5 are configured to determine the logical level of the sal node using the sar node current as a reference. An unreferenced inverter buffers the sal and outputs a signal designated sab. The reset NMOS transistors MN6 and MN7 are configured to pull the sal and sar nodes to ground during a standby (no program and no read) state.

Figure 2E:
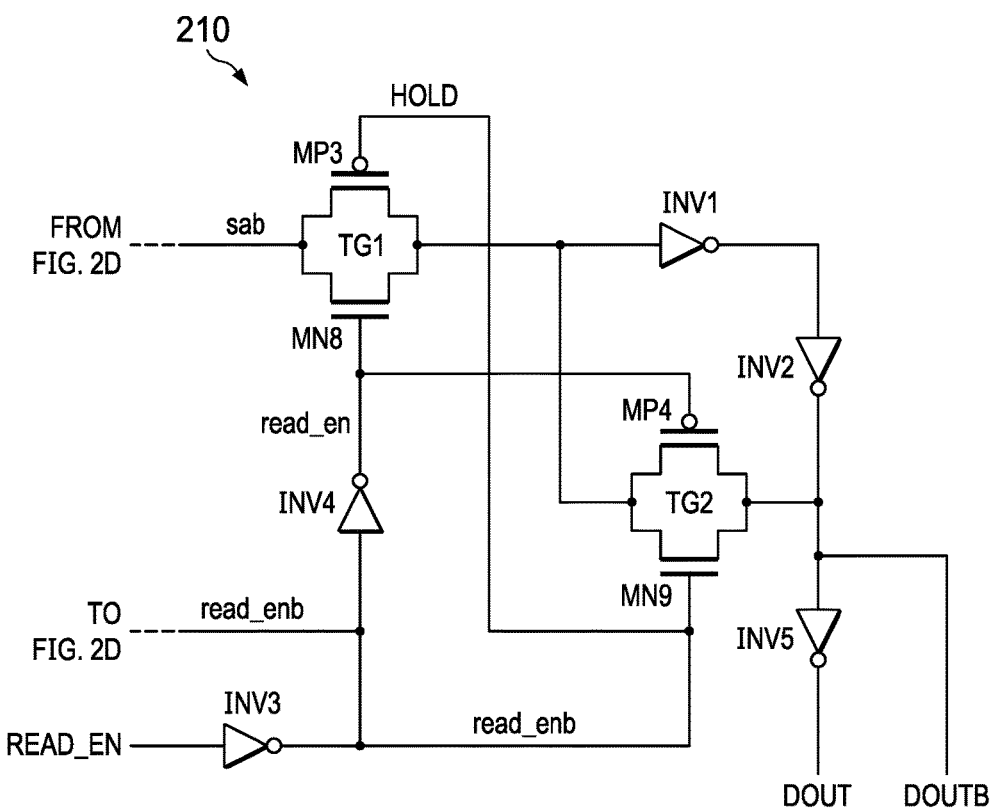

Now considering FIG. 2E, the latch 210 is illustrated in greater detail. The latch 210 includes a PMOS transistor MP3 and an NMOS transistor MN8 that together constitute a first transmission gate TG1. Similarly, a PMOS transistor MP4 and an NMOS transistor MN9 together constitute a second transmission gate TG2. A first terminal of TG1 is connected to an input of an inverter INV1, which in turn has an output connected to an input of an inverted INV2. An output of INV2 is connected to a first terminal of TG2, which in turn has a second terminal connected to the first terminal of TG1 and the input of INV1. The READ_EN signal is inverted by INV3 to produce the signal read_enb, and inverted again by INV4 to produce signal read_en. The read_en signal is connected to the gates of MN8 and MP4, and the read_enb signal is connected to the gates of MN9 and MP3. When READ_EN is asserted (high), MN8 and MP3 are on, and MN9 and MP4 are off. In this state, the signal sab, which represents the inverted value of the stored datum of cell 200, is passed through TG1 and presented at the first terminal of TG2. When READ_EN is de-asserted, MN8 and MP3 are off, and MN9 and MP4 are on. Thus the value earlier presented at the first terminal of TG2 is passed by TG2 to INV1. The loop formed by TG2, INV1 and INV2 stores the value of sab that was presented to TG1 when READ_EN was asserted. Thus the inverted value of the datum stored by the bit cell 200 is output as a signal DOUTB, while an inverter INV5 outputs the non-inverted value DOUT.

The operation of the instances of the cell 200 provides a digital value that may be used for various purposes, such as trimming component values during a trim operation performed after manufacturing the integrated circuit of which the cell 200 is a part. However, because the OTP transistors 205 may only be programmed once, a calibration routine may make use of other circuitry that determines a calibration value required to trim the component value, and then after this determination, store the calibration value to the instances of the cell 200. The other circuitry undesirably requires space that adds to the die size of the integrated circuit.

While the latch 210 is suitable for many implementations, as analog device technology advances there is a need for an OTP trim bit memory cell with reduced area and having a look-through latch in the bit cell. A look-through function provides the ability to pass a data input through the latch and to an output prior to programming the OTP transistors 205 to ensure the stored value is the final desired value. Thus it is desired that such a cell have several characteristics. First, the content of the latch is fed from DIN and goes to QOUT when LOOK_THRU is enabled and latched when LOOK_THRU is disabled. Second the content of the latch is used to program the FAMOS when PROG_EN is enabled. Third the content of the latch is set by the FAMOS state when READ_EN is enabled and latched when READ_EN is disabled. Fourth the latch is symmetrical (including capacitive loadings) between two storage nodes BT and BC to retain data during brownout event. Finally, a reduction of die area needed to implement the latch is highly desired to provide more usable die on a single production wafer. No known memory cells can meet all of the above requirements while achieving a small layout area. For example, in the baseline memory cell 200, the latch 210 is asymmetrical and does not have look-through capability.

These desired attributes may be provided by various example implementations now described that provide a symmetrical latch that replaces the latch 210. The symmetrical latch includes first and second half latches, wherein the driving path from the second half latch to the first half latch is cut off when the first half latch is written, while the driving path from the first half latch to the second half latch is cut off when the second half latch is written. In this manner the symmetrical latch may be used both to output data that represents the value stored by the OTP transistors, and may also store received data used during the calibration routine, and direct the stored data to the OTP transistors for storage after the calibration routine determines the calibration value.

Figure 3A:
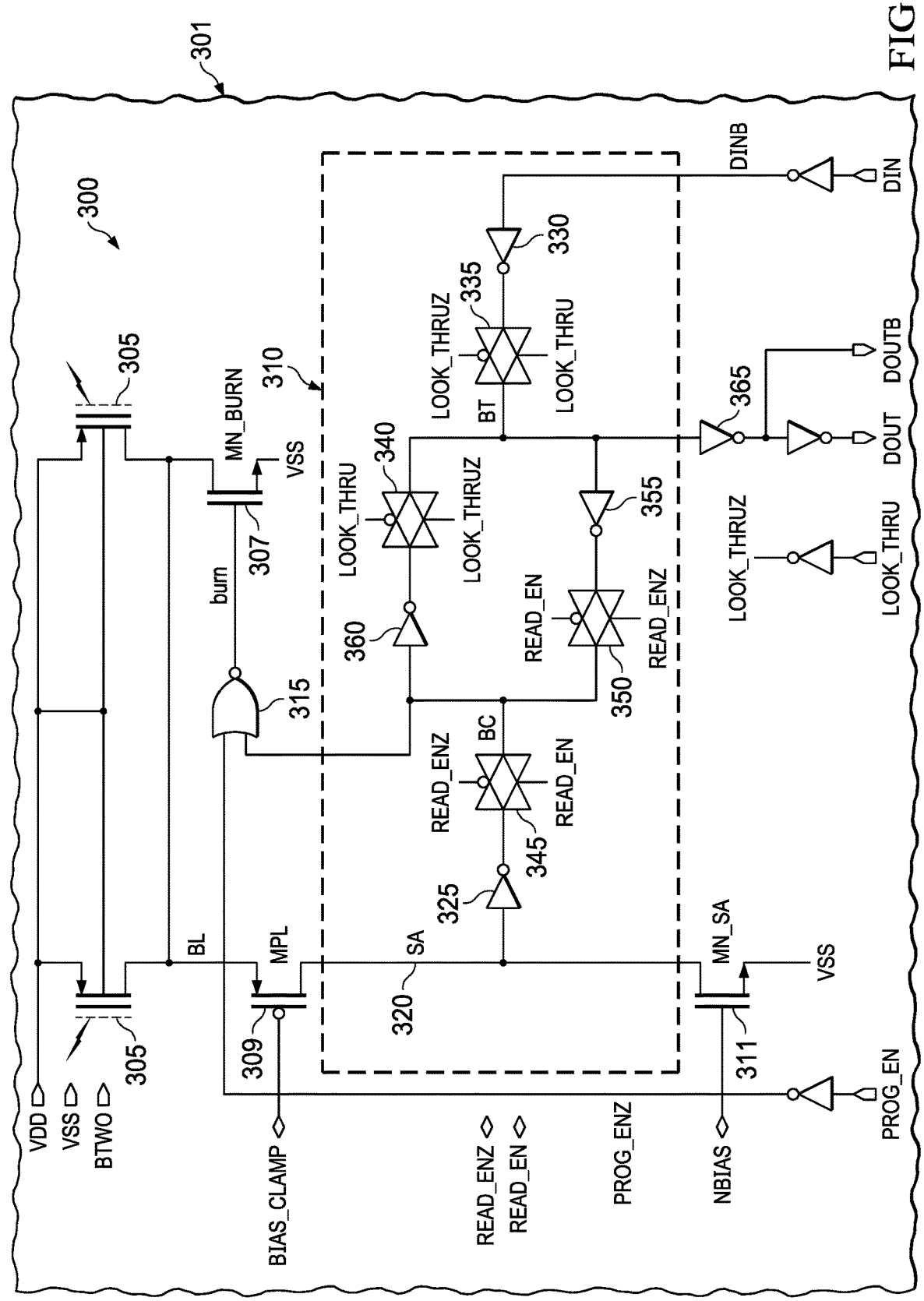
FIGS. 3A-3E illustrate aspects of an example memory cell including a look-through latch circuit.
Figure 3B:
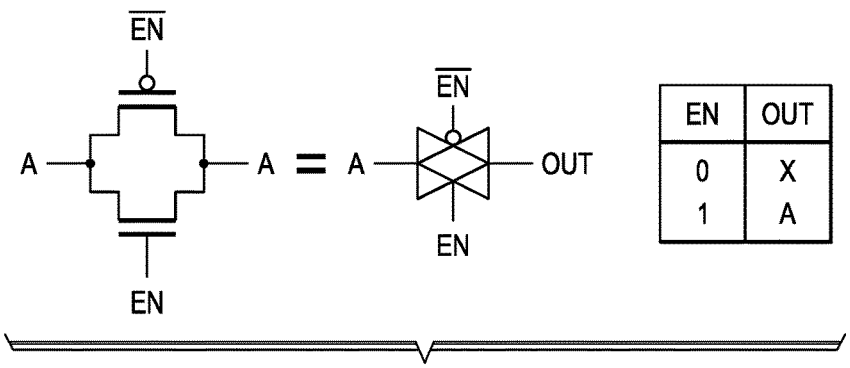

FIG. 3A illustrates one such example of an OTP trim bit memory cell 300, or simply cell 300, formed in or over a semiconductor substrate 301 and including a latch 310. The cell 300 receives several of the control inputs present in the cell 200, including BIAS_CLAMP, PROG_EN, READ_EN and LOOK_THRU, as well as a DIN value specific to that cell 300. OTP transistors 305, which may be of a same or different design than the OTP transistors 205, are configured to store a single datum representing a digital value. While two OTP transistors 305 are shown, the cell 300 may have any number of at least one OTP transistor. A transistor 307, MN_BURN, may be of a same or different design than the transistor MN1 of FIG. 2C, but is controlled by a NOR gate 315 that receives the PROG_ENZ signal and a BC signal described below. Notably, the inverter 207 is not needed, eliminating a PMOS transistor and an NMOS transistor. A bitline BL connected to the sources of the OTP transistors 305 is further connected to the source of a PMOS transistor 309, MPL, that is controlled by the BIAS_CLAMP signal. The drain of the transistor 309 is connected via an SA node 320 to the drain of an NMOS transistor 311, MN_SA that is controlled by a signal NBIAS. The SA node 320 represents the value of the datum stored on the OTP transistors 305. The latch 310 receives the value of the SA node 320 via an inverter 325, and receives the inverted form of DIN, DINB, via an inverter 330. The latch 310 includes four transmission gates, 335, 340, 345 and 350. The transmission gates are shown for convenience using a standard transmission gate symbol, shown in FIG. 3B as equivalent to an NMOS transistor and a PMOS transistor connected in parallel. The transmission gates 335 and 340 are controlled by LOOK_THRU/LOOK_THRUZ, while the transmission gates 345 and 350 are controlled by READ_EN/READ_ENZ. The latch 310 further includes inverters 355 and 360 in addition to the inverters 325 and 330. A storage loop including the transmission gates 340, 350 and inverters 355, 360 includes a BC node and a BT node. An inverter 365 connected to the BT node outputs the datum on BT node to DOUTB. The NOR gate 315 and the inverter 365 are sized the same so the capacitive loadings for the BT and BC nodes are identical, providing symmetry for the latch 310.

Unlike the latch 210, the latch 310 is symmetric, in that the storage loop includes two signal paths that connect the BC and BT nodes, each signal path consisting of one inverter and one transmission gate. These signal paths are antiparallel, in that the path consisting of the inverter 355 and the transmission gate 350 flows from BT to BC, while the path consisting of the inverter 360 and the transmission gate 340 flows from BC to BT. The latch 310 is further symmetric in that each node BC, BT is connected to a data input via an inverter and a transmission gate.

Data may be stored in the latch in either of two ways. FIG. 3D presents a timing diagram that visualizes the relationships between relevant signals. In a first mode of operation, the inverter 330 receives the inverted value of a datum present on DIN. READ_EN is unasserted, so the transmission gate 345 is disabled and the transmission gate 350 is enabled. LOOK_THRU is asserted while DIN is valid, thus disabling the transmission gate 340 and enabling the transmission gate 335, thereby passing DIN to the node BT, and storing DIN in the latch 310 when LOOK_THRU is de-asserted. In a second mode of operation, the inverter 330 receives the inverted value of a datum present on DIN. LOOK_THRU is unasserted, so the transmission gate 335 is disabled and the transmission gate 340 is enabled. READ_EN is briefly asserted, during which the transmission gate 350 is disabled and the transmission gate 345 is enabled. Thus, the inverted value of SA is placed on node BC and is stored in the latch 310 when READ_EN is de-asserted. During read, SA represents the logical value of OTP transistor 305 determined by the sense amplifier by comparing the BL current with a reference current from NMOS transistor 311 MN_SA. The non-inverted value of the SA is output to the node BT by the inverter 360, and the value of BT is output by inverter 365 and an unreferenced inverter as DOUT. Note that the initial resulting sense logic value occurs on the SA node 320 is 0 V or close to VDD, depending on datum stored in the OTP transistors 305. The low end of BL is limited to about two diode $V_t$ drops from VDD by the MPL transistor 309 controlled by BIAS_CLAMP. Thus the BL voltage is not considered a logic signal here.

In view of these modes of operation, the value stored by the latch 310 is made available for evaluation at DOUT. Depending on the history of latching the datum, DOUT may represent a stored value of DIN, or a stored value of SA. In the former case, the latch 310 may act to temporarily store a provisional value of DIN that is produced in the course of determining a calibration value for a trimmed component. The provisional value may be stored indefinitely, and may be replaced by an updated provisional value during the calibration process. Once a final value of DIN is determined that datum may be stored on the OTP transistors 305 via the NOR gate 315 by asserting PROG_EN. Once the datum is stored, the value may be latched into the latch 310 by the previously described read operation whenever desired, e.g. during a device power-up routine.

Figure 3C:
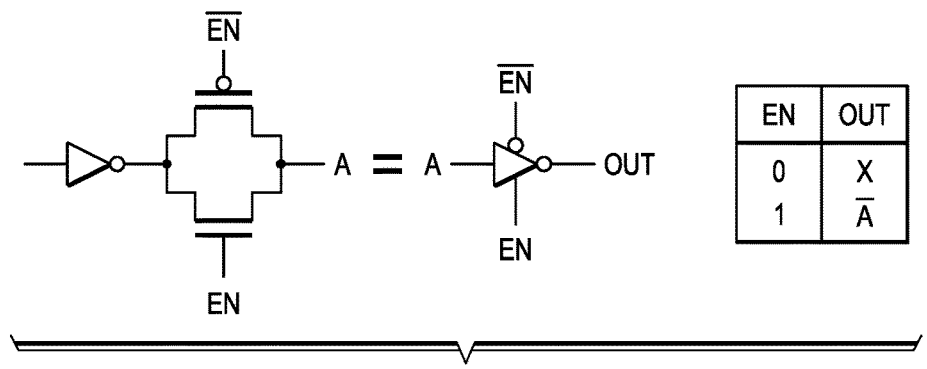
Figure 3E:
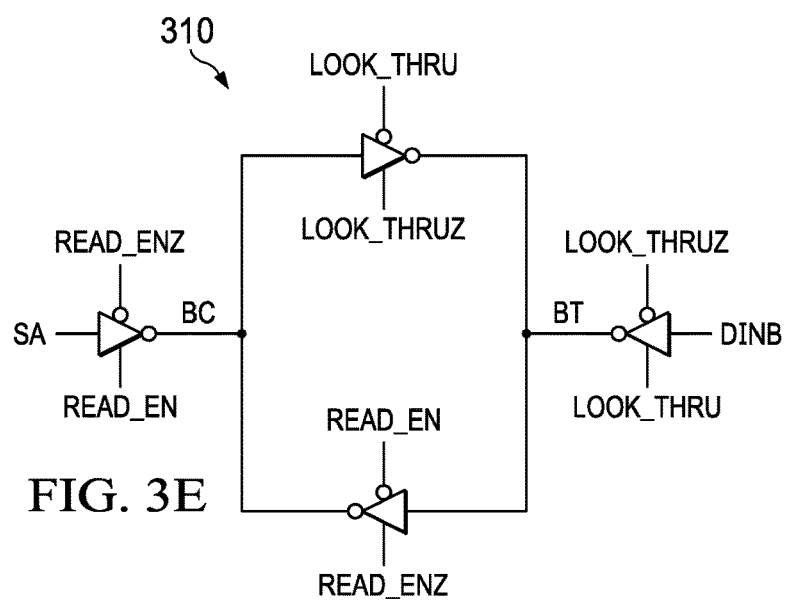
Figure 3D:
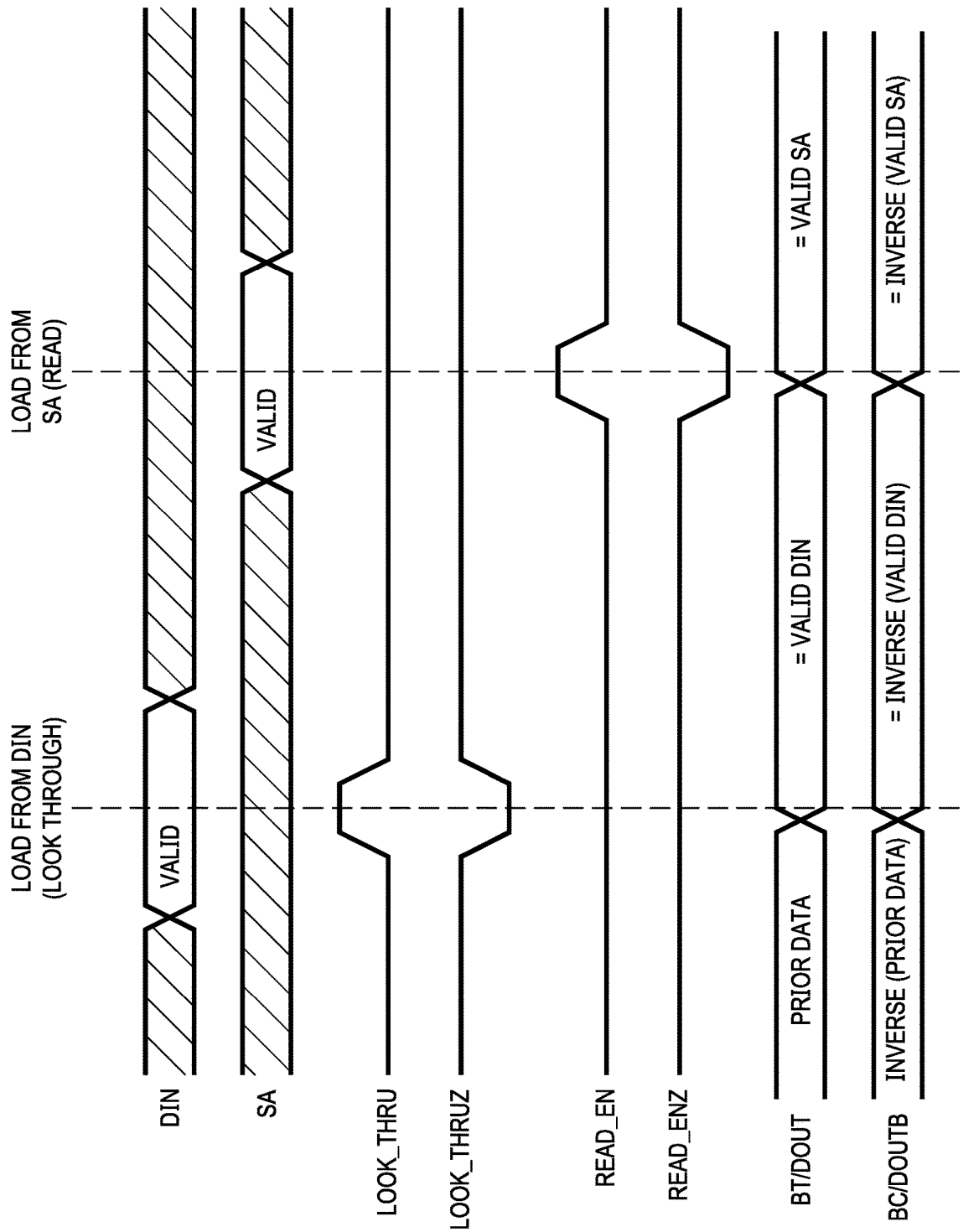

FIG. 3C illustrates an equivalent view of a transmission gate and an inverter as a tri-state inverter. As shown in FIG. 3E, the latch 310 may be compactly represented by two tri-state inverters connected in a ring at a first and second connection node, with a third tri-state inverted connected to the first connection node and a fourth tri-state inverted connected to the second connection node. As will be described further below, the tri-state inverters may be implemented in a manner other than the series connected inverter and transmission gate illustrated in FIG. 3C.

Figure 4A:
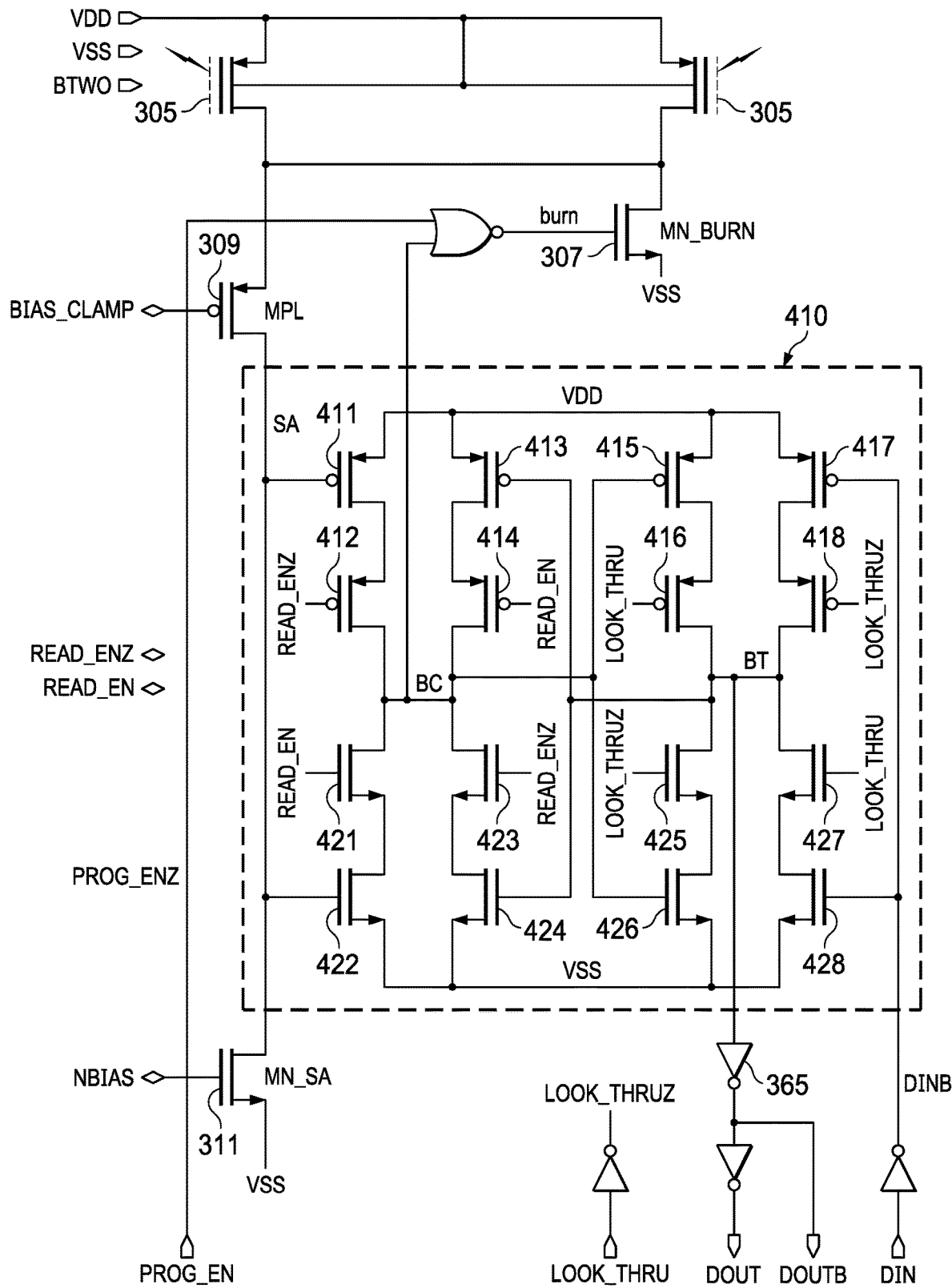

FIG. 4A illustrates another example of a bit cell 400 that includes a latch 410 that implements the functionality described with respect to the latch 310. In this implementation, the transistors that make up the transmission gates 335, 340, 345 and 350, and the inverters 325, 330, 355 and 360, are stacked in a manner that efficiently utilizes die area. The latch 410 includes 8 PMOS transistors designated 411-418, and 8 NMOS transistors designated 421-428. The inverter 325 is implanted by transistors 411 and 422. The transmission gate 345 is implemented by the transistors 412 and 421. The transistors 411, 412, 421 and 422 are stacked in a first column, efficiently implementing the inverter 325 and transmission gate 345. A second column of stacked transistors 413, 414, 423 and 424 implements the transmission gate 350 (transistors 414, 423) and the inverter 355 (transistors 413, 424). A third column of stacked transistors 415, 416, 425 and 426 implements the transmission gate 340 (transistors 416, 425) and the inverter 360 (transistors 415, 426). And a fourth column of stacked transistors 417, 418, 427 and 428 implements the transmission gate 335 (transistors 418, 427) and the inverter 330 (transistors 417, 428). Each of the four columns is connected to a power node VDD and a ground node VSS. Each of the columns of transistors in FIG. 4A may be represented by a tri-state inverter as shown in FIG. 4B. In the example of FIG. 4B, the PMOS transistors are designated MP1 and MP2, and the NMPS transistors are designated MN1 and MN2. The transistors MP2 and MN2 are each connected at a common drain node labeled "out", and together implement a transmission gate. The source of the transistor MP1 is connected to the VDD power node, and the drain is connected to the source of transistor MP2. Similarly, the source of the transistor MN1 is connected to the VSS power node (e.g. ground), and its drain is connected to the source of MN2. The transistors MP1 and MN1 together implement an inverting function.

Figure 4C:
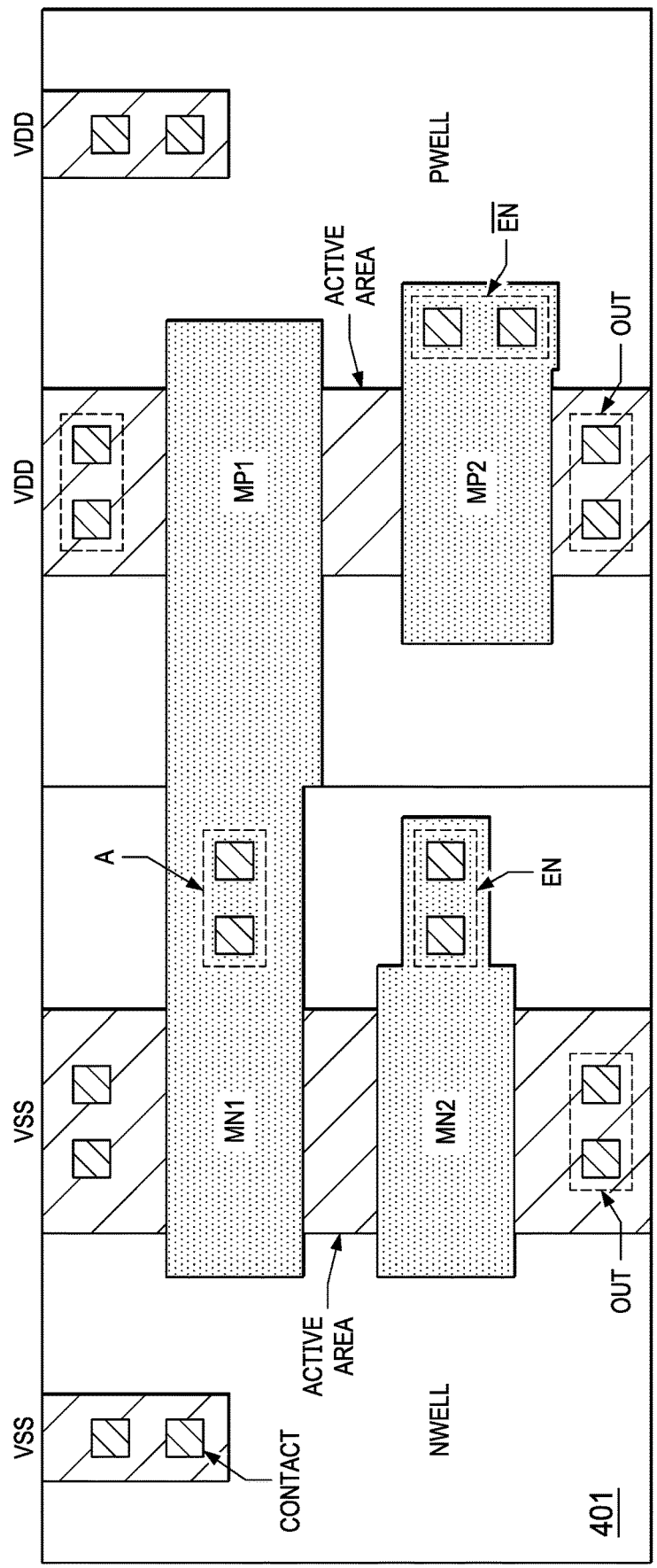
Figure 4D:
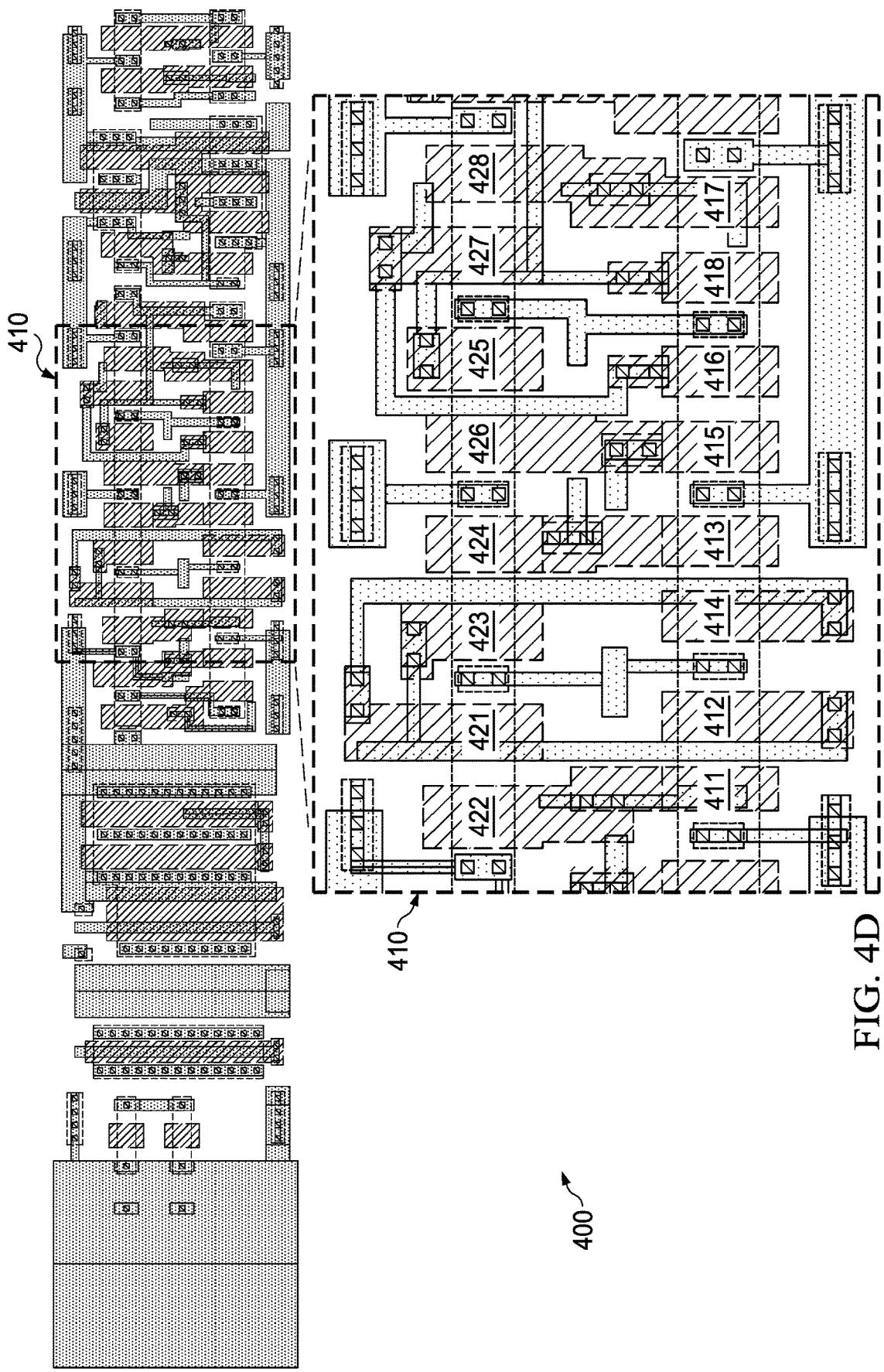

FIG. 4C illustrates an example layout of the four transistors of FIG. 4B. The transistors are formed in or over a semiconductor substrate 401 that includes an PWELL and an NWELL, with the transistors MP1 and MP2 formed in or over the PWELL and MN1 and MN2 formed in or over the NWELL. An active area over the PWELL forms a source/drain path that connects VDD to MP1 and MP1 to MP2. An active area over the NWELL forms a source/drain path that connects VSS to MN1 and MN1 to MN2. The drains of MP2 and MN2 are connected by a conductive trace (not shown) at a common drain node labeled "out". A corresponding instance of this compact functional cell may efficiently implement each of the transistor columns of FIG. 4A. As an example, FIG. 4D illustrates an example layout of circuitry that implements the bit cell 400 using the functional cell of FIG. 4C, showing a portion that implements the latch 410. The area of the bit cell 400 in this example is about 233 µm².

Figure 5:
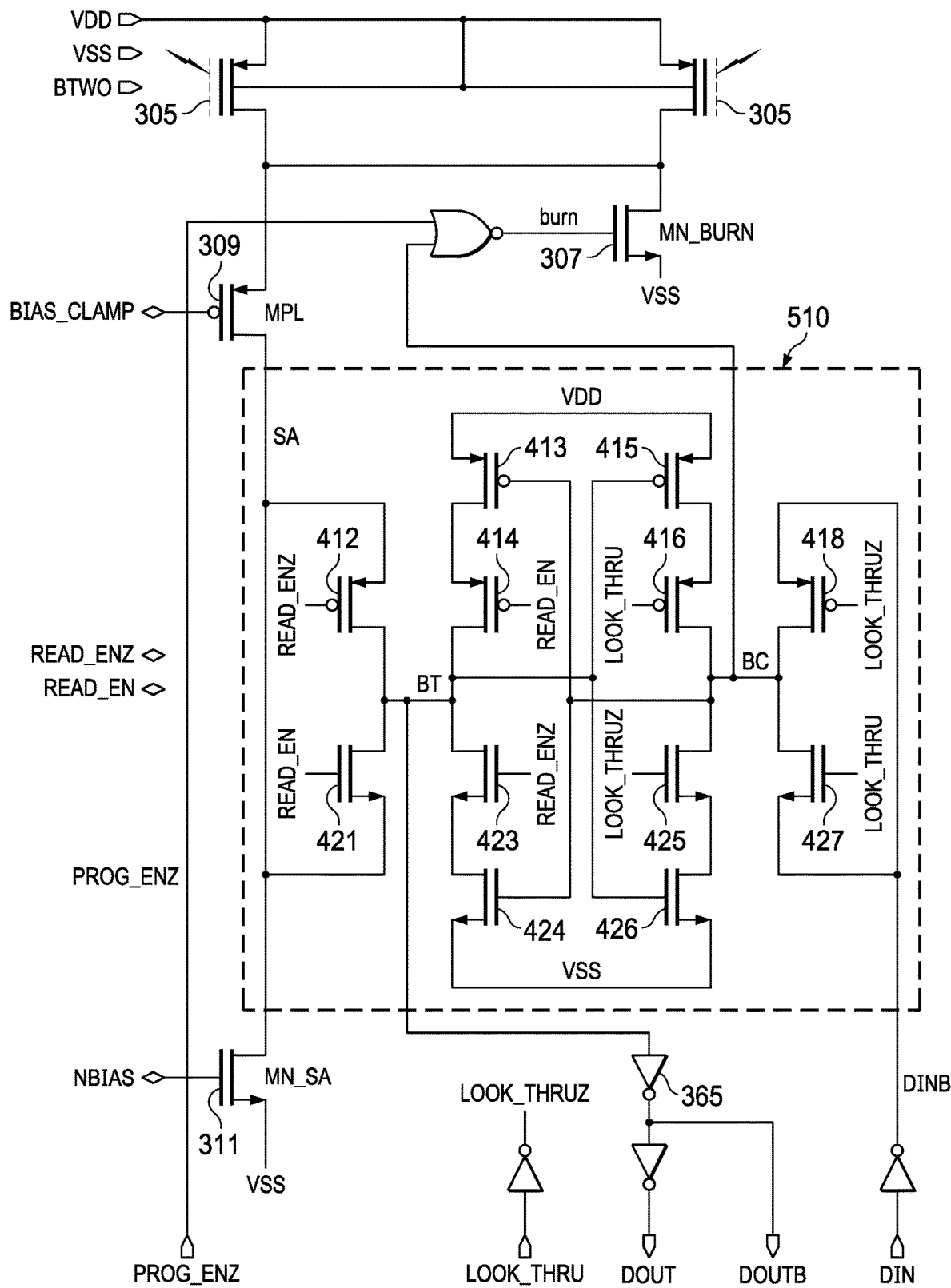
FIG. 5 illustrates another example memory cell including a look-through latch with stacked transistors, in which three inverters are eliminated.

FIG. 5 illustrates an example implementation of a bit cell 500 that includes a latch 510 that omits some inverters, thereby reducing the die area for the latch 510 relative to the latch 410. The inverters 325 and 330, and the unreferenced inverter receiving PROG_EN in FIG. 3, may be removed under some conditions, thereby deleting six transistors. These conditions may include, e.g., (a) the minimum voltage of the READ_EN/READ_ENZ and LOOK_THRU/LOOK_THRUZ signals is sufficiently higher than the threshold voltage of the transistors 412, 421, 418, 427, or a non-smooth transition of voltage (vs. time) through the transmission gates formed by transistors 412/421 or 418/427 at a minimum read/look through voltage is not a factor (e.g., for regression of timing data during characterization), and independently, (b) an active low program enable (PROG_ENZ) is allowable in a specific implementation. Under such conditions the example of FIG. 5 with reduced component count may be implemented, reducing power consumption and required die area.

Figure 6:
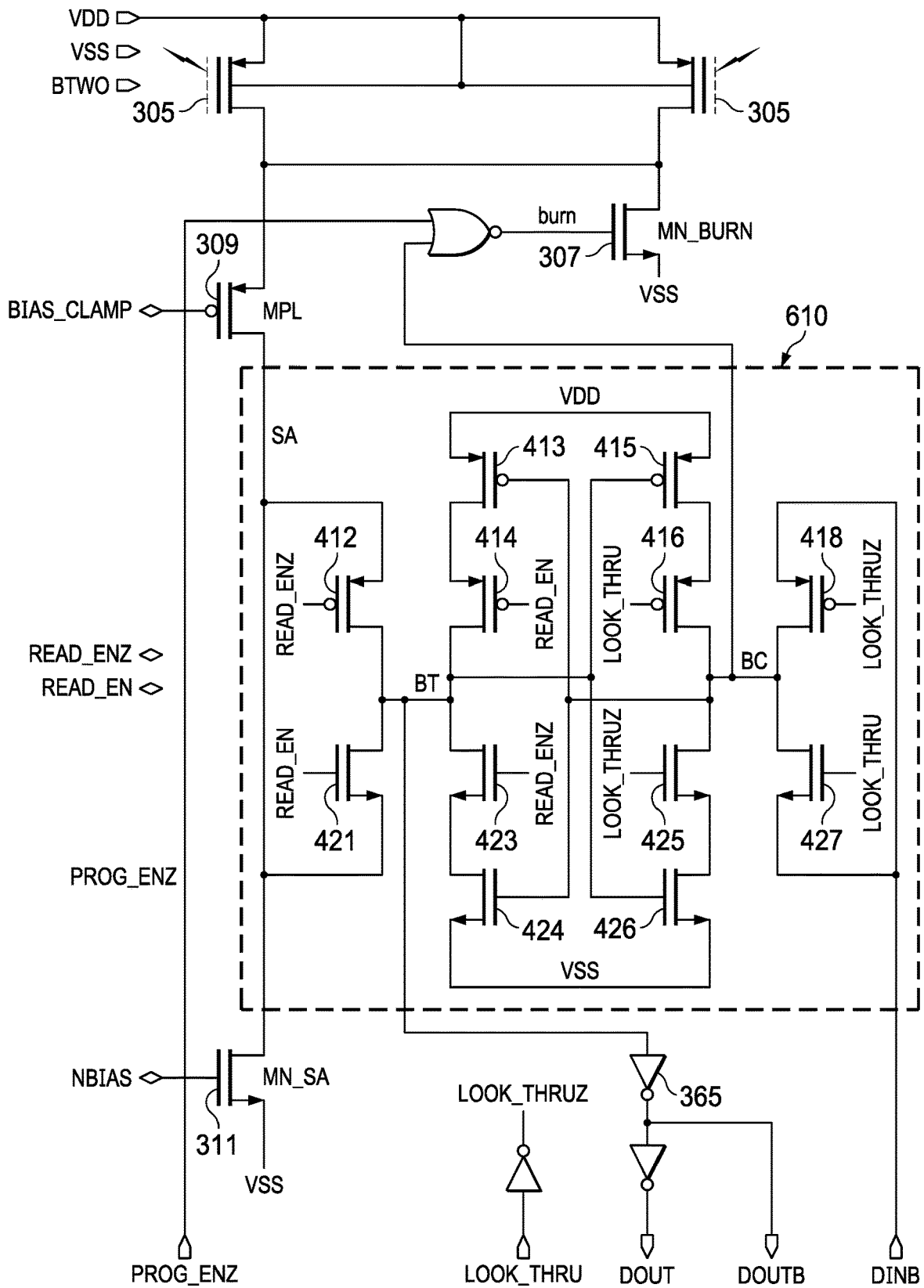
FIG. 6 illustrates another example memory cell including a look-through latch with stacked transistors, in which another inverter is eliminated.

FIG. 6 illustrates an example implementation of a bit cell 600 that further omits the unreferenced inverter shown in FIG. 5 that receives the DIN signal. This inverter may be omitted for implementations that do not otherwise require the non-inverse polarity of DIN, further simplifying the bit cell 600 and reducing required power and die area.

Referring back to FIG. 3A, it is seen that the sense amplifier circuit shown in FIG. 2D is not present in the cell 300. Instead the function provided by the sense amplifier circuit is provided by the transistors MPL and MN_SA. As previously described the cell 200 uses the NMOS transistors MN6 and MN7 in parallel with the mirror transistors MN4 and MN5 to reset the sal node to 0V during standby. In part to reduce die area consumed by the cell 300, if possible functionality is moved into a control cell that controls multiple instances of the cell 300 to avoid repetitious placement of circuitry. In such examples this reset may preferably be controlled by a global signal from the control cell. Such examples may impose an additional constraint on timing in that it may be necessary during a read operation that the latch 310 is latched after the sense data (equivalent of sal in the FIG. 2) becomes valid and before the reset is enabled.

FIG. 7 provides an example of a suitable control circuit 700 that may be implemented in a control cell that generates global signals that control operation of one or more instances of the cell 300, 400, 500 or 600. The control circuit provides NBIAS such that NBIAS is at VDD during standby, thereby implementing the reset function by causing the transistor MN_SA (FIG. 3) to pull the SA node 320 to ground. During a read operation the control circuit provides NBIAS at a normal bias voltage thereby generating the sense reference current on the SA node 320 in the cell 300.

Referring to FIG. 7, a PMOS transistor 705, an NMOS transistor 710 and an inverter 715 each receive the EN_BIAS signal. During standby, EN_BIAS is low, so NBIAS is pulled/held high by the PMOS transistor 705. When EN_BIAS is high during a read operation, the NMOS transistor 710 is on and PMOS transistor 705 is off, and the output of the inverter 715 is low, thereby turning on PMOS transistor 720 and turning off the NMOS transistor 725. NBIAS is thereby connected to NGATE with the NMOS transistor 730 acting a diode in the current mirror for generating the sense amp reference current in cooperation with the NMOS transistor MN_SA shown in FIG. 3A.

Figure 8:
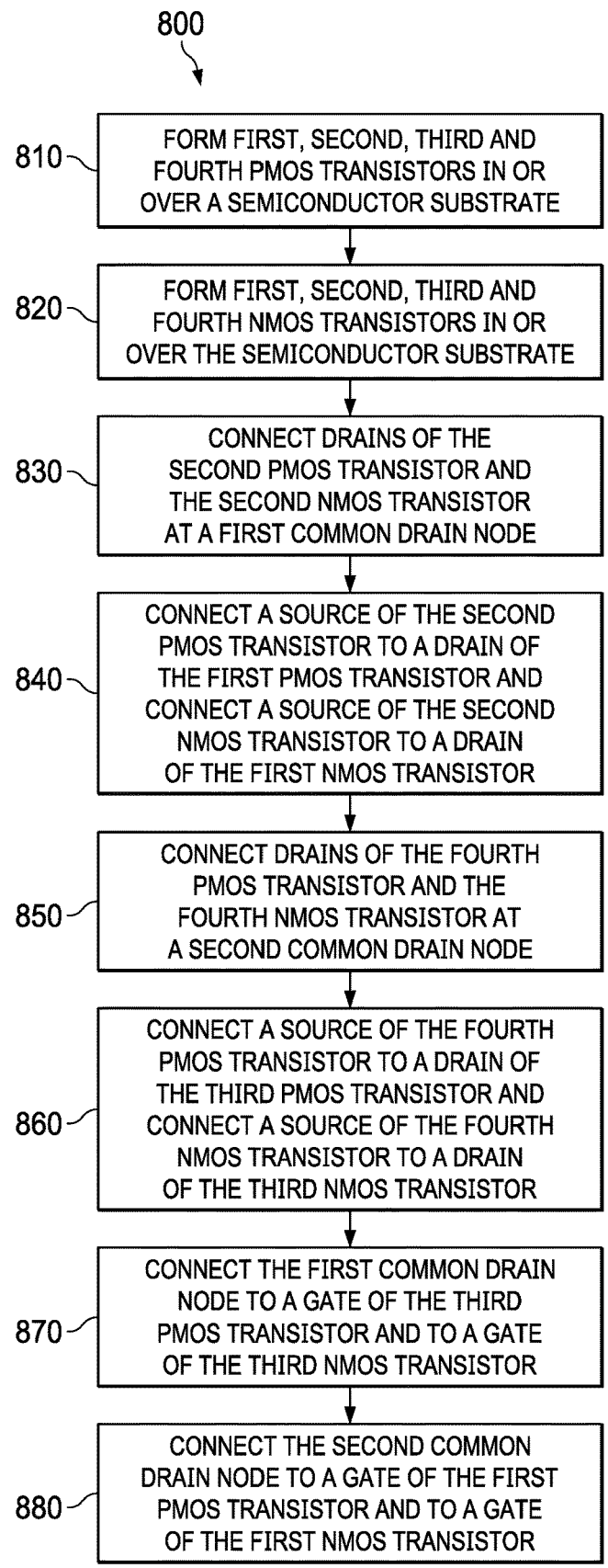
FIG. 8 illustrates an example method that implements at least one of the example memory cells.

In accordance with various examples set forth herein, FIG. 8 presents a method 800 of forming an integrated circuit, e.g. an integrated circuit such as that described with respect to FIG. 3A, 4A, 5 or 6. In a step 810, first, second, third and fourth PMOS transistors are formed in or over a semiconductor substrate. In a step 820, first, second, third and fourth NMOS transistors are formed in or over the semiconductor substrate. In a step 830 the drains of the second PMOS transistor and the second NMOS transistor are connected at a first common drain node. In a step 840 the source of the second PMOS transistor is connected to the drain of the first PMOS transistor, and the source of the second NMOS transistor is connected to the drain of the first NMOS transistor. In a step 850 the drains of the fourth PMOS transistor and the fourth NMOS transistor are connected at a second common drain node. In a step 860 the source of the fourth PMOS transistor is connected to the drain of the third PMOS transistor, and the source of the fourth NMOS transistor is connected to the drain of the third NMOS transistor. In a step 870 the first common drain node is connected to the gate of the third PMOS transistor and to the gate of the third NMOS transistor. In a step 880 the second common drain node is connected to the gate of the first PMOS transistor and to the gate of the first NMOS transistor.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A bit cell of a semiconductor device, comprising:
   a first PMOS transistor and a first NMOS transistor connected in series between a power node and a ground node;
   a second PMOS transistor and a second NMOS transistor connected at a first common drain node and connected in series between the first PMOS transistor and the first NMOS transistor, the second PMOS and second NMOS transistors respectively configured to receive a true and a complement of a first control signal at their gates;
   a third PMOS transistor and a third NMOS transistor connected in series between the power node and the ground node; and
   a fourth PMOS transistor and a fourth NMOS transistor connected at a second common drain node and connected in series between the third PMOS transistor and the third PMOS transistor, the fourth PMOS transistor and the fourth NMOS transistor respectively configured to receive a true and a complement of a second control signal at their gates,
   wherein the gates of the first PMOS and first NMOS transistors are connected to the second common drain node, and the gates of the third PMOS and third NMOS transistors are connected to the first common drain node.

2. The bit cell of claim 1, further comprising a first transmission gate having a first terminal connected to the first common drain node, and a second transmission gate having a first terminal connected to the second common drain node.

3. The bit cell of claim 2, wherein a second terminal of the first transmission gate is configured to receive a first data signal and a second terminal of the second transmission gate is configured to receive a second data signal.

4. The bit cell of claim 1, wherein the first, second, third and fourth PMOS transistors and first, second, third and fourth NMOS transistors are configured to latch a first data signal received at the first common drain node on command of the first control signal received at gates of the second PMOS transistor and the second NMOS transistor, and to latch a second data signal received at the second common drain node on command of a second control signal received at gates of the fourth PMOS transistor and the fourth NMOS transistor.

5. The bit cell of claim 4, wherein the first common drain node is configured to receive the first data signal from a sense amplifier signal node electrically coupled to a one-time programmable transistor.

6. The bit cell of claim 1, wherein the second common drain node is connected to a data input terminal configured to make a latched datum available for evaluation.

7. The bit cell of claim 1, wherein the first common drain node is connected to a gate that when enabled stores a latched datum to a one-time programmable transistor.

8. The bit cell of claim 7, wherein the gate is a NOR gate configured to receive a program enable signal.

9. The bit cell of claim 1, wherein the first and second PMOS transistors and first and second NMOS transistors share a first source/drain path, and the third and fourth PMOS transistors and third and fourth NMOS transistors share a second source/drain path.

10. The bit cell of claim 9, further comprising:
    a fifth PMOS transistor and a fifth NMOS transistor connected in series along a third source/drain path between the power node and the ground node; and
    a sixth PMOS transistor and a sixth NMOS transistor connected at the first common drain node and connected in series along the third source/drain path and between the fifth PMOS transistor and the fifth NMOS transistor, the sixth PMOS and sixth NMOS transistors respectively configured to receive the complement and the true of the first control signal at their gates.

11. A method of manufacturing a memory bit cell in an integrated circuit, comprising:
    forming a first PMOS transistor and a first NMOS transistor in or over a semiconductor substrate, connecting a source of the first PMOS transistor to a power node, and connecting a source of the first NMOS transistor to a ground node;
    forming a second PMOS transistor and a second NMOS transistor in or over the semiconductor substrate, connecting drains of the second PMOS transistor and the second NMOS transistor at a first common drain node, connecting a source of the second PMOS transistor to a drain of the first PMOS transistor and connecting a source of the second NMOS transistor to a drain of the first NMOS transistor;
    forming a third PMOS transistor and a third NMOS transistor in or over the semiconductor substrate, connecting a source of the third PMOS transistor to the power node, and connecting a source of the third NMOS transistor to the ground node;
    forming a fourth PMOS transistor and a fourth NMOS transistor in or over the semiconductor substrate, connecting drains of the fourth PMOS transistor and the fourth NMOS transistor at a second common drain node, connecting a source of the fourth PMOS transistor to a drain of the third PMOS transistor and connecting a source of the fourth NMOS transistor to a drain of the third NMOS transistor;

connecting the first common drain node to a gate of the third PMOS transistor and to a gate of the third NMOS transistor; and connecting the second common drain node to a gate of the first PMOS transistor and to a gate of the first NMOS transistor.

12. The method of claim 11, further comprising forming in or over the semiconductor substrate first and second transmission gates, and connecting a first terminal of the first transmission gate to the first common drain node, and connecting a first terminal of the second transmission gate to the second common drain node.

13. The method of claim 12, wherein a second terminal of the first transmission gate is configured to receive a first data signal and a second terminal of the second transmission gate is configured to receive a second data signal.

14. The method of claim 11, wherein the first, second, third and fourth PMOS transistors and first, second, third and fourth NMOS transistors are configured to latch a first data signal received at the first common drain node on command of a first control signal received at gates of the second PMOS transistor and the second NMOS transistor, and to latch a second data signal received at the second common drain node on command of a second control signal received at gates of the fourth PMOS transistor and the fourth NMOS transistors.

15. The method of claim 14, wherein the first common drain node is configured to receive the first data signal from a sense amplifier signal node electrically coupled to a one-time programmable transistor.

16. The method of claim 11, wherein the second common drain node is connected to a terminal configured to make a latched datum available for trimming evaluation.

17. The method of claim 11, wherein the first common drain node is connected to a gate that when enabled stores a latched datum to a one-time programmable transistor.

18. The method of claim 17, wherein the gate is a NOR gate configured to receive a program enable signal.

19. The method of claim 11, wherein the first and second PMOS transistors and first and second NMOS transistors share a first source/drain path, and the third and fourth PMOS transistors and third and fourth NMOS transistors share a second source/drain path.

20. The method of claim 19, further comprising:

forming in or over the semiconductor substrate a fifth PMOS transistor and a fifth NMOS transistor connected in series along a third source/drain path between the power node and the ground node; and forming a sixth PMOS transistor and a sixth NMOS transistor connected at the first common drain node and connected in series along the third source/drain and between the fifth PMOS transistor and the fifth NMOS transistor, the sixth PMOS and sixth NMOS transistors respectively configured to receive the complement and the true of a first control signal at their gates.

21. A semiconductor device, comprising:

a data latch including a first transmission gate and a second transmission gate;

a first inverter connected to a first terminal of the first transmission gate and connected to a first terminal of the second transmission gate at a first node;

a second inverter connected between a second terminal of the first transmission gate at a second node, and connected to a second terminal of the second transmission gate;

a third transmission gate connected between a first data source and the first node; and a fourth transmission gate connected between a second data source and the second node.

* * * * *